(12) United States Patent
Deore et al.

(10) Patent No.: US 11,891,532 B2
(45) Date of Patent: Feb. 6, 2024

(54) COPPER INK FOR HIGH CONDUCTIVITY FINE PRINTING

(71) Applicant: National Research Council of Canada, Ottawa (CA)

(72) Inventors: Bhavana Deore, Ottawa (CA); Chantal Paquet, Ottawa (CA); Patrick Roland Lucien Malenfant, Ottawa (CA)

(*) Notice: Subject to any disclaimer, the term of this patent is extended or adjusted under 35 U.S.C. 154(b) by 309 days.

(21) Appl. No.: 16/954,228

(22) PCT Filed: Dec. 20, 2018

(86) PCT No.: PCT/IB2018/060453
§ 371 (c)(1),
(2) Date: Jun. 16, 2020

(87) PCT Pub. No.: WO2019/123384
PCT Pub. Date: Jun. 27, 2019

(65) Prior Publication Data
US 2021/0079247 A1 Mar. 18, 2021

Related U.S. Application Data

(60) Provisional application No. 62/609,410, filed on Dec. 22, 2017.

(51) Int. Cl.
*C09D 11/52* (2014.01)
*B41M 1/12* (2006.01)
(Continued)

(52) U.S. Cl.
CPC ............... *C09D 11/52* (2013.01); *B41M 1/12* (2013.01); *C08K 3/28* (2013.01); *C08K 5/098* (2013.01);
(Continued)

(58) Field of Classification Search
CPC ...................................................... C09D 11/52
See application file for complete search history.

(56) References Cited

U.S. PATENT DOCUMENTS 5,045,236 A   9/1991  Tsunaga et al.
5,248,451 A   9/1993  Tsunaga et al.
              (Continued)

FOREIGN PATENT DOCUMENTS

CN    106147405 A    11/2016
EP      3127969 A1    2/2017
              (Continued)

OTHER PUBLICATIONS

Search report dated Jun. 27, 2022 on Taiwan application 107146489.
(Continued)

*Primary Examiner* — William D Young
(74) *Attorney, Agent, or Firm* — Brunet & Co. Ltd; Hans Koenig; Robert Brunet

(57) ABSTRACT

A copper-based ink contains copper acetate, 3-dimethylamino-1,2-propanediol and a silver salt. The ink may be coated on a substrate and decomposed on the substrate to form a conductive copper coating on the substrate. The ink provides micron-thick traces and may be screen printed and thermally sintered in the presence of up to about 500 ppm of oxygen or photo-sintered in air to produce highly conductive copper features. Sintered copper traces produced from the ink have improved air stability, and have improved sheet resistivity for 5-20 mil wide screen-printed lines with excellent resolution.

16 Claims, 1 Drawing Sheet

(51) Int. Cl.

| | |
|---|---|
| C08K 3/28 | (2006.01) |
| C08K 5/098 | (2006.01) |
| C08K 5/17 | (2006.01) |
| C09D 11/037 | (2014.01) |
| C09D 11/104 | (2014.01) |
| H05K 1/09 | (2006.01) |

(52) U.S. Cl.
CPC .............. *C08K 5/17* (2013.01); *C09D 11/037* (2013.01); *C09D 11/104* (2013.01); *H05K 1/092* (2013.01); *H05K 2203/1131* (2013.01)

(56) References Cited

U.S. PATENT DOCUMENTS

| | | | |
|---|---|---|---|
| 6,036,889 | A | 3/2000 | Kydd |
| 7,691,294 | B2 | 4/2010 | Chung et al. |
| 9,028,599 | B2 | 5/2015 | Abe |
| 2006/0261316 | A1* | 11/2006 | Jun .......................... H01B 1/22 252/500 |
| 2008/0178761 | A1 | 7/2008 | Tomotake et al. |
| 2014/0349017 | A1 | 11/2014 | Abe |
| 2016/0081189 | A1 | 3/2016 | Shimoda et al. |

FOREIGN PATENT DOCUMENTS

| | | | |
|---|---|---|---|
| JP | 2010176976 A | | 8/2010 |
| JP | 2011034750 A | | 2/2011 |
| JP | 2015172226 A | | 10/2015 |
| WO | 2015/198022 A1 | | 12/2015 |

OTHER PUBLICATIONS

First Examination Report dated Mar. 21, 2022 on Chinese application 2018800874399.
First Examination Report dated Dec. 1, 2021 on Indian application 202027024900.
Extended European Search Report dated Aug. 23, 2021 on European application 18890104.5.
International Search Report and Written Opinion dated Apr. 9, 2019 on PCT/IB2018/060453.
Li Y, et al. J Mater Sci: Mater Electron (2016) 27:11432-11438.
Yong Y, et al. Scientific Reports | 7:45150 | DOI: 10.1038/srep45150.
Kawaguchi Y, et al. Journal of Coating Science and Technology, 2016, 3, 56-61.
Yabuki A, et al. Materials Chemistry and Physics 148 (2014) 299e304.
Araki T, et al. Langmuir 2013, 29, 11192-11197.
Yim C, et al. ACS Appl. Mater. Interfaces 2016, 8, 22369-22373.
Akiyama Y, Advanced Engineering Materials 2017, DOI: 10.1002/adem.201700259.
Chung W-H, et al. Nanotechnology 27 (2016) 205704 (13 pp).
Deng D, et al. ACS Appl. Mater. Interfaces 2013, 5, 3839-3846.
Farraj Y, et al. Chem. Commun., 2015, 51, 1587.
Hwang Y-T, et al. ACS Appl. Mater. Interfaces 2016, 8, 8591-8599.
Joo S-J, et al. ACS Appl. Mater. Interfaces 2015, 7, 5674-5684.
Pajor-Swierzy A, et al. Colloids and Surfaces A: Physicochem. Eng. Aspects 521 (2017) 272-280.
Pajor-Swierzy A, et al. Colloids and Surfaces A: Physicochem. Eng. Aspects 522 (2017) 320-327.
Sugiyama T, et al. J Mater Sci: Mater Electron (2016) 27:7540-7547.
Suren S, et al. Thin Solid Films 607 (2016) 36-42.
Tam SK, et al. J Mater Sci (2017) 52:5617-5625.
Yu M-H, et al. Nanotechnology 28 (2017) 205205 (11pp).
Robert N. Grass and Wendelin J. Stark, Flame spray synthesis under a non-oxidizing atmosphere: Preparation of metallic bismuth nanoparticles and nanocrystalline bulk bismuth metal, Journal of Nanoparticle Research (2006) 8: 729-736.
Min Jung Lee, Dong Soon Noh, Eun Kyung Lee, Characteristics of large-area porous media burner applicable to direct-fired non-oxidizing annealing furnace, Applied Thermal Engineering 186 (2021) 116489.
Daria Serafin, Wojciech J. Nowak, Bartek Wierzba, Mechanically prepared copper surface in oxidizing and non-oxidizing conditions, Applied Surface Science 492 (2019) 607-616.
Q. Fu, M. Stein, W. Li, J. Zheng and F. E. Kruis, "Conductive films prepared from inks based on copper nanoparticles synthesized by transferred arc discharge", Nanotechnology, vol. 31, No. 2, pp. 025302-025314, 2020.
Qingqing Fu, Wen Li and Frank Einar Kruis, Highly conductive copper films prepared by multilayer sintering of nanoparticles synthesized via arc discharge, Nanotechnology 34 (2023) 225601.
M.K. Kang, J.W. Kim, M.G. Kwak, H.G. Yoon, Y.S. Kim, Characteristics of conductive ink using octanethiolated copper nanoparticles produced via inert-gas condensation, 18th International Conference on Composite Materials, 2011.
Shin, D.-H.; Woo, S.; Yem, H.; Cha, M.; Cho, S.; Kang, M.; Jeong, S.; Kim, Y.; Kang, K.; Piao, Y. A Self-Reducible and Alcohol-Soluble Copper-Based Metal-Organic Decomposition Ink for Printed Electronics. ACS Appl. Mater. Interfaces 2014, 6, 3312-3319, DOI: 10.1021/am4036306.

* cited by examiner

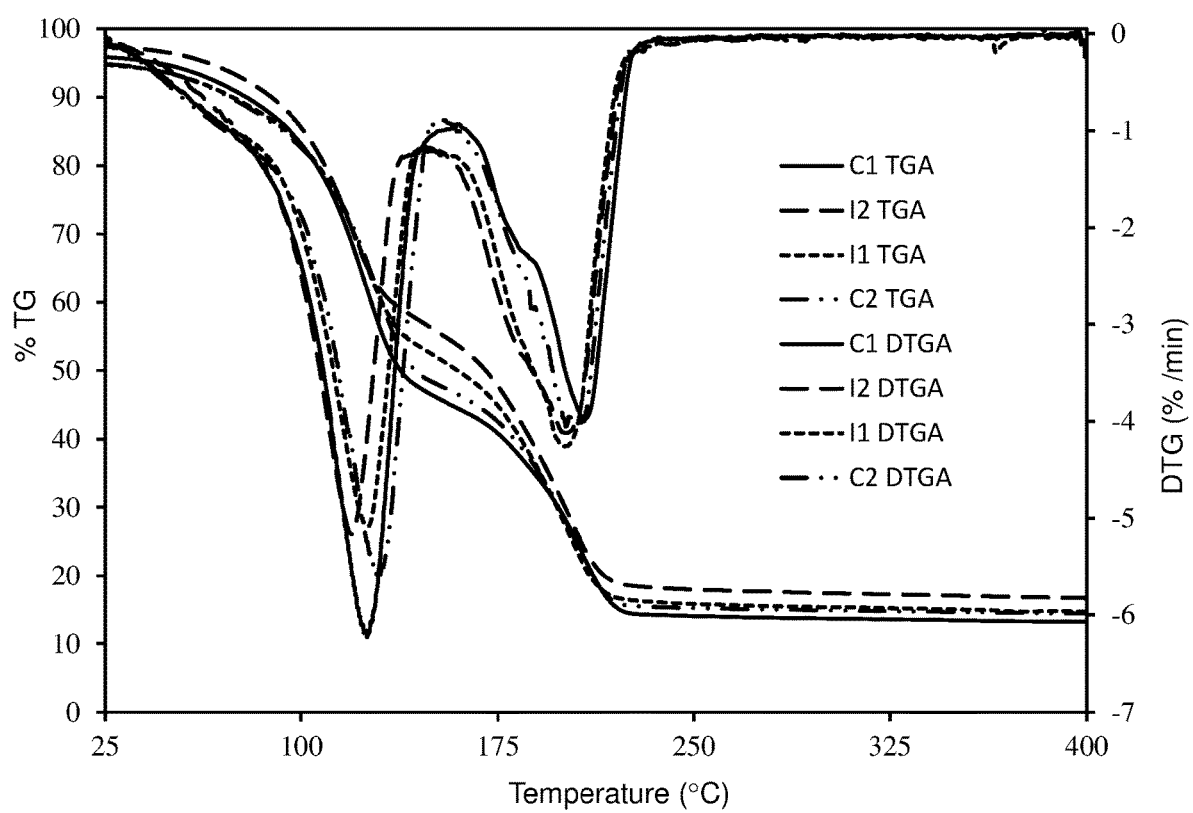

COPPER INK FOR HIGH CONDUCTIVITY FINE PRINTING

FIELD

This application relates to printing inks, particularly to printing inks for printed electronics.

BACKGROUND

Low price, high conductivity and high oxidation resistance are important targets for inks in printed electronics. Gold (Au) and silver (Ag) are expensive but stable i.e. resistant to oxidation. Compared to these metals, copper (Cu) is cheaper and has a similar conductivity, however copper readily oxidizes so high conductivity is difficult to attain in printed traces.

Two main types of copper inks are used: metal nanoparticle-based inks; and, metal-organic decomposition (MOD) inks. Nanoparticle-based copper inks are expensive and need high Cu loading to obtain high conductivity. Nanoparticle-based inks must be sintered at very high temperatures and/or must be need laser/flash light sintered Nanoparticle-based inks are also easily oxidized. Inexpensive versions (Novacentrix™) only screen print well on cardboard and must be photo-sintered. MOD inks enable thermal sintering at lower temperature but expensive copper precursors such as copper formate are typically used. Also, MOD inks are not typically viscous which precludes screen printing. Corrosion caused by strong acid vapor, e.g. formic acid, and poor conductivity due to low metal content are other limitations often seen with Cu MOD inks.

There are very few reports of low cost, high conductivity and oxidation resistant screen printable inks which can be thermally as well as photo-sintered to produce conducting traces. To obtain high conductivity Cu traces, high loading Cu nano inks (about 35-70% Cu in the total ink) are needed. Strategies to prevent oxidation require the incorporation of silver into the NPs to produce bimetallic Ag—Cu nanoparticles inks which increases the cost. As such, a challenge remains to reduce the oxidation of the copper and create cost-effective copper-based inks for printed electronics. Low cost copper salts have not been demonstrated to make good inks with all the requirements listed above.

There is a need for low cost, high resolution, high conductivity, oxidation resistant screen printable inks that can be thermally and/or photo-sintered to enable fine printing. Low cost copper inks that are screen printable on polymeric substrates and that can be photo-sintered or thermally sintered would have immediate commercial value.

SUMMARY

In one aspect, there is provided a copper-based ink comprising copper acetate, 3-dimethylamino-1,2-propanediol and a silver salt.

In another aspect, there is provided a method of producing a conductive copper coating on a substrate, the method comprising: coating a substrate with a copper-based ink comprising copper acetate, 3-dimethylamino-1,2-propanediol and a silver salt; and, decomposing the ink on the substrate to form a conductive copper coating on the substrate.

Advantageously, the ink is low cost and is capable of being formulated for screen printing applications. Micron-thick traces of the ink may be screen printed and thermally sintered in the presence of up to about 500 ppm of oxygen or photo-sintered in air to produce highly conductive copper features. Sintered copper traces produced from the ink have improved air stability compared to traces produced from other copper inks. The sintered copper traces have good adhesion strength. Copper nanoparticles may be included to further increase conductivity and/or oxidation resistance of sintered copper traces, and/or to further enhance screen printability of the ink. Sintered copper traces having sheet resistivity of about 20 m$\Omega$/□/mil or less may be obtained for 5-20 mil wide screen-printed lines with excellent resolution.

Further features will be described or will become apparent in the course of the following detailed description. It should be understood that each feature described herein may be utilized in any combination with any one or more of the other described features, and that each feature does not necessarily rely on the presence of another feature except where evident to one of skill in the art.

BRIEF DESCRIPTION OF THE DRAWINGS

For clearer understanding, preferred embodiments will now be described in detail by way of example, with reference to the accompanying drawings, in which:

FIG. 1 depicts thermograms of various inks comprising copper acetate monohydrate ($Cu(CH_3COO)_2 \cdot H_2O$) and 3-dimethylamino-1,2-propanediol (DMAPD).

DETAILED DESCRIPTION

The copper-based ink comprises copper acetate, 3-dimethylamino-1,2-propanediol (DMAPD) and a silver salt. The DMAPD (($CH_3)_2NCH_2CH(OH)CH_2OH$) is a readily available organic compound. The copper acetate ($Cu(CH_3COO)_2$) is a readily available inorganic compound and may be hydrated or not hydrated. Hydrated copper acetate may comprise a monohydrate ($Cu(CH_3COO)_2 \cdot H_2O$), which is convenient to use and less expensive than anhydrous copper acetate. In the ink, copper acetate and DMAPD form a complex. The copper acetate is preferably present in the ink in an amount that provides about 40 wt % of copper or less, based on total weight of ink. The copper acetate is preferably present in the ink in an amount that provides about 1 wt % of copper or more, based on total weight of ink. The copper acetate is preferably present in the ink in an amount that provides about 1 wt % to about 40 wt % of copper, based on total weight of the ink. The amount of copper, which the copper acetate provides is more preferably in a range of about 3 wt % to about 30 wt %, or about 3 wt % to about 25 wt %, or about 5 wt % to about 20 wt %, or about 5 wt % to about 15 wt %, based on total weight of the ink. Preferably, the copper acetate and DMAPD are in the ink in a molar ratio of about 1:1 to about 1:2. More preferably, the molar ratio of copper acetate to DMAPD is about 1:1.3. Such molar ratios are particularly advantageous for improving conductivity of conductive copper traces formed from the ink.

The ink is preferably substantially devoid of any other complex-forming amine component. Complex-forming amine components are amine-containing compounds, which form coordination complexes with copper ions. The ink is preferably substantially devoid of any copper precursor compound other than the copper acetate. Copper precursor compounds are any compounds of copper ions and ligands, which may be sintered to form copper metal.

The silver salt may be any organic or inorganic salt of silver that is decomposable to yield metallic silver and a readily removable residue, preferably a gaseous residue at the decomposition temperature of the silver salt. The silver salt comprises one or more anions. The anions are preferably derived from mineral acids. The anions in the metal salts are preferably oxide, chloride, bromide, sulfate, carbonate, phosphate, acetate or nitrate. Nitrates are particularly preferred. A particularly preferred metal salt filler is silver nitrate. The silver salt is preferably present in the ink in an amount of up to about 40 wt %, preferably up to about 20 wt %, based on total weight of copper from the copper acetate in the ink. Preferably, the amount of silver salt is 5 wt % or more, based on total weight of copper from the copper acetate in the ink. Preferably, the amount of silver salt is in a range of about 2 wt % to about 40 wt %, or about 5 wt % to about 40 wt %, or about 5 wt % to about 20 wt %, or about 5 wt % to about 15 wt %, or about 5 wt % to about 10 wt %, based on total weight of copper from the copper acetate in the ink.

The ink may also comprise one or more other components useful for the formulation of inks for specific purposes or for improving electrical, physical and/or mechanical properties of conductive traces formed from the ink. In various embodiments, the ink may comprise one or more of a filler, a binder, a surface tension modifier, a defoaming agent, a thixotropy modifying agent, a solvent, or any mixture thereof.

The filler may comprise a metal, another metal-containing compound or a mixture thereof to improve conductivity of conductive traces formed from the ink. The filler preferably comprises copper nanoparticles (CuNP). Nanoparticles are particles having an average size along a longest dimension in a range of about 1-1000 nm, preferably about 1-500 nm, more preferably about 1-100 nm. The nanoparticles, may be flakes, nanowires, needles, substantially spherical or any other shape. The filler is preferably present in the ink in an amount of up to about 40 wt %, based on weight of copper from the copper acetate in the ink. Preferably, the amount of filler is in a range of about 1 wt % to about 40 wt %, or about 5 wt % to about 30 wt %, or about 10 wt % to about 30 wt %, based on weight of copper from the copper acetate in the ink.

The binder, for example an organic polymer binder, may be present in the ink as a processing aid for particular deposition processes. The organic polymer binder may be any suitable polymer, preferably a thermoplastic or elastomeric polymer. Some non-limiting examples of binders are cellulosic polymers, polyacrylates, polystyrenes, polyolefins, polyvinylpyrrolidone, polypyrrolidone, polyvinyl acetals, polyesters, polyimides, polyether imides, polyols, silicones, polyurethanes, epoxy resins, phenolic resins, phenol formaldehyde resins, styrene allyl alcohols, polyalkylene carbonates, fluoroplastics, fluoroelastomers, thermoplastic elastomers and mixtures thereof. The organic polymer binder may be homopolymeric or copolymeric. A particularly preferred binder comprises a polyester, polyimide, polyether imide or any mixture thereof. The polymeric binder preferably comprises a polyester. Suitable polyesters are commercially available or may be manufactured by the condensation of poly alcohols with poly carboxylic acid and respectively their anhydrides. Preferred polyesters are hydroxyl and/or carboxyl functionalized. The polyester may be linear or branched. Solid or liquid polyesters as well as diverse solution forms may be utilized. In a particularly preferred embodiment, the polymeric binder comprises a hydroxyl- and/or carboxyl-terminated polyester, for example Rokrapol™ 7075. The polymeric binder may be present in the ink in any suitable amount. The organic polymer binder may be present in the ink in any suitable amount, preferably in a range of about 0.05 wt % to about 10 wt %, based on total weight of the ink. More preferably, the amount is in a range of about 0.05 wt % to about 5 wt %, or about 0.2 wt % to about 2 wt %, or about 0.2 wt % to about 1 wt %. In one embodiment, the polymeric binder is present in the ink in an amount of about 0.02-0.8 wt %, more preferably about 0.05-0.6 wt %.

The surface tension modifier may be any suitable additive that improves flow and leveling properties of the ink. Some non-limiting examples are surfactants (e.g. cationic or anionic surfactants), alcohols (e.g. propanol), propane diols, decanoic acid, dodecanethiol, glycolic acid, lactic acid and mixtures thereof. The surface tension modifier may be present in the ink in any suitable amount, preferably in a range of about 0.1 wt % to about 5 wt %, based on total weight of the ink. More preferably, the amount is in a range of about 0.5 wt % to about 4 wt %, or about 0.8 wt % to about 3 wt %. In one especially preferred embodiment, the amount is in a range of about 1 wt % to about 2.7 wt %.

The defoaming agent may be any suitable anti-foaming additive. Some non-limiting examples are fluorosilicones, mineral oils, vegetable oils, polysiloxanes, ester waxes, fatty alcohols, glycerol, stearates, silicones, polypropylene based polyethers and mixtures thereof. Glycerol and polypropylene based polyethers are particularly preferred. In the absence of the defoaming agent, some printed traces may tend to retain air bubbles following printing, resulting in nonuniform traces. The defoaming agent may be present in the ink in any suitable amount, preferably in a range of about 0.0001 wt % to about 3 wt %, based on total weight of the ink. More preferably, the amount is in a range of about 0.005 wt % to about 2 wt %.

The thixotropy modifying agent may be any suitable thixotropy-modifying additive. Some non-limiting examples are polyhydroxycarboxylic acid amides, polyurethanes, acrylic polymers, latex, polyvinylalcohol, styrene/butadiene, clay, clay derivatives, sulfonates, guar, xanthan, cellulose, locust gum, acacia gum, saccharides, saccharide derivatives, cassein, collagen, modified castor oils, organosilicones and mixtures thereof. The thixotropy modifying agent may be present in the ink in any suitable amount, preferably in a range of about 0.05 wt % to about 1 wt %, based on total weight of the ink. More preferably, the amount is in a range of about 0.1 wt % to about 0.8 wt %. In one especially preferred embodiment, the amount is in a range of about 0.2 wt % to about 0.5 wt %.

The solvent may be an aqueous solvent or an organic solvent. In some instances, a mixture of one or more organic solvents with an aqueous solvent may be utilized. Aqueous solvents include, for example, water and solutions, dispersions or suspension of compounds in water. The organic solvent may be aromatic, non-aromatic or a mixture of aromatic and non-aromatic solvents. Aromatic solvents include, for example, benzene, toluene, ethylbenzene, xylenes, chlorobenzene, benzyl ether, anisole, benzonitrile, pyridine, diethylbenzene, propylbenzene, cumene, isobutylbenzene, p-cymene, tetralin, trimethylbenzenes (e.g. mesitylene), durene, p-cumene or any mixture thereof. Non-aromatic solvents include, for example, terpenes, glycol ethers (e.g. dipropylene glycol methyl ether, diethylene glycol, methylcarbitol, ethylcarbitol, butylcarbitol, triethyleneglycol and derivatives thereof), alcohols (e.g. methylcyclohexanols, octanols, heptanols) or any mixture thereof. Dipropylene glycol methyl ether is preferred. The solvent may be present in the ink in any suitable amount, preferably in a range of about 1 wt % to about 50 wt %, based on total weight of the ink. More preferably, the amount is in a range of about 2 wt % to about 35 wt %, or about 5 wt % to about 25 wt %. The solvent generally makes up the balance of the ink.

The ink may be formulated by mixing the components together in a mixer. Generally, any mixing process is suitable. However, planetary centrifugal mixing (e.g. in a Thinky™ mixer) is particularly useful. Mixing time may have some impact on the electrical properties of conductive traces formed from the ink. Properly mixing the ink ensures good electrical properties of the conductive traces. The mixing time is preferably about 25 minutes or less, or about 20 minutes or less, or about 15 minutes or less. The mixing time is preferably about 1 minute or more, or about 5 minutes or more.

Prior to decomposition, the ink is deposited on a substrate to coat the substrate. Suitable substrates may include, for example polyethylene terephthalate (PET) (e.g. Melinex™), polyolefin (e.g. silica-filled polyolefin (Teslin™)), polydimethylsiloxane (PDMS), polystyrene, acrylonitrile/butadiene/styrene, polycarbonate, polyimide (e.g. Kapton™) polyetherimide (e.g. Ultem™), thermoplastic polyurethane (TPU), silicone membranes, printed wiring board substrate (e.g. FR4), wool, silk, cotton, flax, jute, modal, bamboo, nylon, polyester, acrylic, aramid, spandex, polylactide, paper, glass, metal, dielectric coatings, among others.

The ink may be coated on the substrate by any suitable method, for example printing. Printing methods may include, for example, screen printing, stencilling, inkjet printing, flexography printing, gravure printing, off-set printing, stamp printing, airbrushing, aerosol printing, typesetting, slot-die coating or any other method. It is an advantage of the process that an additive method such as screen printing or stenciling are particularly useful. For printed electronic devices, the ink may be coated on the substrate as traces.

After coating the substrate with the ink, the ink on the substrate may be dried and decomposed to form a copper metal coating on the substrate. Drying and decomposition may be accomplished by any suitable technique, where the techniques and conditions are guided by the type of substrate and the particular composition of the ink. For example, drying and decomposing the ink may be accomplished by heating and/or photonic sintering.

In one technique, heating the substrate dries and sinters the ink coating to form metallic copper. Heating may be performed at a temperature of about 100° C. or higher, about 140° C. or higher, or about 165° C. or higher, or about 180° C. or higher, while producing conductive copper coatings that have good oxidation stability. The temperature may be in a range of about 140° C. to about 300° C., or about 150° C. to about 280° C., or about 160° C. to about 270° C., or about 180° C. to about 250° C. Heating is preferably performed for a time in a range of about 1-180 minutes, for example 5-120 minutes, or 5-90 minutes. Heating may be performed in stages to first dry the ink coating and then sinter the dried coating. Drying may be performed at any suitable temperature, for example at a temperature in a range of about 100° C. to about 150° C. Drying may be performed for any suitable length of time, for example about 1-180 minutes, or 5-90 minutes, or 10-45 minutes. Sintering is performed at a sufficient balance between temperature and time to sinter the ink to form conductive copper coatings. Drying and/or sintering may be performed with the substrate under an inert atmosphere (e.g. nitrogen and/or argon gas). However, improved air stability of the ink permits sintering in the presence of oxygen, for example in an atmosphere comprising up to about 500 ppm of oxygen. The type of heating apparatus also factors into the temperature and time required for drying and sintering.

In another technique, the ink coating may be dried with heat and then photonically sintered. Drying may be performed at any suitable temperature, for example at a temperature in a range of about 100° C. to about 150° C. Drying may be performed for any suitable length of time, for example about 1-180 minutes, or 5-90 minutes, or 10-45 minutes. A photonic sintering system may feature a high intensity lamp (e.g. a pulsed xenon lamp) that delivers a broadband spectrum of light. The lamp may deliver about 1-30 J/cm$^2$, preferably 2-5 J/cm$^2$, in energy to the traces. Pulse widths are preferably in a range of about 0.58-1.5 ms. Photonic sintering nay be performed in air, or in an inert atmosphere. Laser sintering may be utilized, if desired. Photonic sintering is especially suited when polyethylene terephthalate or polyimide substrates are used.

A sintered copper coating formed from the ink may have a sheet resistivity of about 20 mΩ/□/mil or less, even about 15 mΩ/□/mil or less, for 5-20 mil wide screen-printed lines. The sheet resistivity may even be in a range of about 5-10 mΩ/□/mil. The sintered copper coating formed from the ink may have a volume resistivity of about 50 μΩ.cm or less, even about μΩ.cm or less, for 5-20 mil wide screen-printed lines. Further, line resolution is excellent with changes in line width after sintering for 5-20 mil wide screen-printed lines of less than about 17%, or less than about 10%, or less than about 5%, or less than about 2.5%. Even when line widths are as low as about 5 mil, the change in line width after sintering may be less than about 17%, even less than about 5%, or even less than about 2.5%. Line widths may be about 600 microns or lower, for example in a range of about 10 microns to about 600 microns, or about 55 microns to 550 microns for screen printed traces. Furthermore, the sintered copper coatings formed from the ink may be flexible, being able to pass the ASTM F1683-02 flex & crease test without any open circuit breaks (i.e. without open fails). A change in resistivity (R) of 20% or less is considered to be a pass in the ASTM F1683-02 flex & crease test. Open circuit breaks are defined as a total loss in conductivity (i.e. infinite resistivity).

The substrate having sintered copper coatings thereon may be incorporated into an electronic device, for example electrical circuits (e.g. printed circuit boards (PCBs), conductive bus bars (e.g. for photovoltaic cells), sensors (e.g. touch sensors, wearable sensors), antennae (e.g. RFID antennae), thin film transistors, diodes, smart packaging (e.g. smart drug packaging), conformable inserts in equipment and/or vehicles, and multilayer circuits and MIM devices including low pass filters, frequency selective surfaces, transistors and antenna on conformable surfaces that can withstand high temperatures.

EXAMPLES

Example 1—Preparation of Inks

Molecular inks as shown in Table 1 were generally formulated by mixing copper compound and amine in the stated ratio, together with the listed amounts of silver salt (AgNO$_3$), solvent (water) and filler (CuNP) in a planetary centrifugal mixer (e.g. in a Thinky™ mixer) for about 15-30 min at room temperature. Copper compounds, amines and AgNO$_3$ were obtained from Sigma-Aldrich Corporation. CuNP (TEKNA™) filler was obtained from Advanced Material Inc. The amounts silver salt and filler are given as wt % to the amount of Cu metal in the total ink. Cu(HCO$_2$)$_2$·H$_2$O is copper formate monohydrate. EtOx is 2-ethyl-2-oxazoline.

TABLE 1

| Ink | Copper Compound | Amine | Cu:Amine Ratio | AgNO$_3$ (wt %) | H$_2$O (eq) | CuNP |
|---|---|---|---|---|---|---|
| I1 | Cu(CH$_3$COO)$_2$•H$_2$O | DMAPD | 1:1.3 | 10 | — | — |
| I2 | Cu(CH$_3$COO)$_2$•H$_2$O | DMAPD | 1:1.3 | 20 | — | — |
| I3 | Cu(CH$_3$COO)$_2$•H$_2$O | DMAPD | 1:1.3 | 5 | 1 | — |
| I4 | Cu(CH$_3$COO)$_2$•H$_2$O | DMAPD | 1:1.3 | 10 | 0.5 | — |
| I5 | Cu(CH$_3$COO)$_2$•H$_2$O | DMAPD | 1:1.3 | 20 | 1 | — |
| C1 | Cu(CH$_3$COO)$_2$•H$_2$O | DMAPD | 1:1.3 | — | — | — |
| C2 | Cu(CH$_3$COO)$_2$•H$_2$O | DMAPD | 1:1.3 | — | — | 10 |
| C3 | Cu(CH$_3$COO)$_2$•H$_2$O | DMAPD | 1:1.3 | — | 1 | — |
| C4 | Cu(CH$_3$COO)$_2$•H$_2$O | DMAPD | 1:1.3 | — | 0.5 | 10 |
| C5 | Cu(HCO$_2$)$_2$•H$_2$O | DMAPD | 1:1.2 | — | 1 | — |
| C6 | Cu(HCO$_2$)$_2$•H$_2$O | DMAPD | 1:1.2 | 5 | 0.5 | — |
| C7 | Cu(CH$_3$COO)$_2$•H$_2$O | 95% EtOx 5% DMAPD | 1:1.3 | 5 | 0.5 | — |

Example 2—Thermal Analysis of Inks

Thermogravimetric analyses of the inks were performed on a Netzsch TG 209 F1 under BOC HP argon (grade 5.3) gas and residual oxygen was trapped with a Supelco Big-Supelpure™ oxygen/water trap.

Table 2 and FIG. 1 illustrate the results of thermogravimetric analyses under argon of inks C1, C2, I1 and I2 prepared as described in Example 1. Table 2 indicates the thermal decomposition temperature for each ink, the amount of residue left over at 400° C. after thermal decomposition (% based on total weight of the ink), the amount of metal in the ink (wt % of Cu or Cu/Ag based on total weight of the ink), and whether the ink can be sintered by thermal and photo methods (Y=yes, N=no). The results indicate that inks based on copper acetate and DMAPD could be thermally and photo-sintered.

TABLE 2

| Ink | Decomposition Temp. (° C.) | Residue (%) at 400° C. | wt % metal in the ink | Sintering Thermal/Photo |
|---|---|---|---|---|
| I1 | 124.6, 200.9 | 14.65 | 20.0 | Y/Y |
| I2 | 119.2, 200.6 | 16.65 | 22.1 | Y/Y |
| C1 | 125, 207.9 | 13.18 | 17.9 | Y/Y |
| C2 | 129.3, 203.5 | 14.40 | 19.7 | Y/Y |

Example 3—Sintering of Screen Printed Cu Traces

Various inks were screen printed on a substrate to form traces and then sintered. The inks were screen printed onto 8.5 in.×11 in. sheets of Kapton™ film using an American M&M S-912M small format screen printer through patterns photoimaged onto MIM emulsion (10-14 μm) supported on a SS403 stainless steel mesh (Dynamesh, IL). The samples were processed via photonic sintering, the printed traces were dried to remove the solvent and subsequently processed under ambient conditions using a PulseForge™ 1300 Novacentrix photonic curing system.

Example 3-1—Ink I3

Ink I3 was screen printed on a Kapton™ substrate, dried in a reflow oven at 140° C. for 20 min, and photo-sintered by the Novacentrix PulseForge™ system at 2.87 J/cm$^2$ to form metallic copper traces on the substrate. Table 3 and Table 4 provide physical and electrical properties of the copper traces and Table 5 provides mechanical properties (mechanical test as per ASTM F1683-02 flex & crease test). The results show that ink I3 having copper acetate, DMAPD and 5 wt % AgNO$_3$ provides photo-sintered conducting copper traces with excellent resolution and good mechanical properties, (i.e. less than 20% change in resistance following flex and crease testing). It should be noted that these results were achieved in the absence of a binder.

TABLE 3

| Nominal linewidth (mil) | Ω | Measured Linewidth (mil) | Slump (mil) | Measured Linewidth (μm) | Ω/□ | mΩ/□ |
|---|---|---|---|---|---|---|
| 2 | 1009 | 2.40 | 0.20 | 61.00 | 0.62 | 615 |
| 3 | 423 | 3.58 | 0.29 | 91.00 | 0.38 | 385 |
| 5 | 143 | 6.42 | 0.71 | 163.00 | 0.23 | 233 |
| 10 | 69.7 | 10.59 | 0.30 | 269.00 | 0.19 | 187 |
| 15 | 46.6 | 15.37 | 0.19 | 390.50 | 0.18 | 182 |
| 20 | 31.6 | 20.55 | 0.28 | 522.00 | 0.16 | 165 |

TABLE 4

| Nominal linewidth (mil) | Line thickness (μm) | Sheet resistivity (mΩ/□/mil) | Volume resistivity (μΩ · cm) |
|---|---|---|---|
| 2 | 0.26 | 6.30 | 16.00 |
| 3 | 0.50 | 7.50 | 19.05 |
| 5 | 0.83 | 7.57 | 19.22 |
| 10 | 0.98 | 7.23 | 18.37 |
| 15 | 1.07 | 7.63 | 19.38 |
| 20 | 0.96 | 6.20 | 15.75 |

TABLE 5

| | | Nominal line widths | | | | | |
|---|---|---|---|---|---|---|---|
| | | 2 mil | 3 mil | 5 mil | 10 mil | 15 mil | 20 mil |
| Compressive flex | % change in R | 2.9 ± 1.1 | 5.3 ± 1.9 | 6.7 ± 1.8 | 5.7 ± 1.4 | 6.3 ± 1 | 6.5 ± 0.4 |
| | open fails | 0/3 | 0/3 | 0/3 | 0/3 | 0/3 | 0/3 |
| Tensile flex | % change in R | 14.6 ± 3.2 | 19.4 ± 4 | 21 ± 1.5 | 17.7 ± 1.7 | 19.3 ± 2.7 | 20.2 ± 2.6 |
| | open fails | 0/3 | 0/3 | 0/3 | 0/3 | 0/3 | 0/3 |

TABLE 5-continued

| | | Nominal line widths | | | | | |
|---|---|---|---|---|---|---|---|
| | | 2 mil | 3 mil | 5 mil | 10 mil | 15 mil | 20 mil |
| Compressive crease | % change in R | 3.3 ± 1.5 | 7.2 ± 3.5 | 6.3 ± 2 | 5.9 ± 2.1 | 6.6 ± 1.2 | 6.1 ± 2.4 |
| | open fails | 0/3 | 0/3 | 0/3 | 0/3 | 0/3 | 0/3 |
| Tensile crease | % change in R | 6.1 ± 1.1 | 7.1 ± 3.2 | 8.6 ± 0.6 | 8 ± 0.7 | 9 ± 4.5 | 9.9 ± 0.6 |
| | open fails | 0/3 | 0/3 | 0/3 | 0/3 | 0/3 | 0/3 |

Example 3-2—Ink I4

Ink I4 was screen printed on a Kapton™ substrate, dried in a reflow oven at 140° C. for 20 min, and photo-sintered by PulseForge™ sintering at 2.76 J/cm$^2$ to form sintered copper traces on the substrate. Table 6 and Table 7 provide physical and electrical properties of the copper traces and Table 8 provides mechanical properties (mechanical test as per ASTM F1683-02 flex & crease test). The results show that ink I4 having copper acetate, DMAPD, 10 wt % AgNO$_3$ and some added water provides photo-sintered conducting copper traces with excellent resolution and reasonable flex properties, even without a binder.

TABLE 6

| Nominal linewidth (mil) | Ω | Measured Linewidth (mil) | Slump (mil) | Measured Linewidth (μm) | Ω/□ | mΩ/□ |
|---|---|---|---|---|---|---|
| 2 | 1045 | 2.30 | 0.15 | 58 | 0.61 | 611 |
| 3 | 489 | 3.25 | 0.12 | 82 | 0.40 | 403 |
| 0.37 | 175 | 5.33 | 0.12 | 13 | 0.24 | 237 |
| 10 | 67 | 10.77 | 0.16 | 273 | 0.18 | 183 |
| 15 | 49 | 15.24 | 0.06 | 387 | 0.19 | 190 |
| 20 | 33 | 20.41 | 0.02 | 518 | 0.17 | 171 |

TABLE 7

| Nominal linewidth (mil) | Line thickness (μm) | Sheet resistivity (mΩ/□/mil) | Volume resistivity (μΩ · cm) |
|---|---|---|---|
| 2 | 0.27 | 6.38 | 16.20 |
| 3 | 0.37 | 5.80 | 14.72 |
| 5 | 0.96 | 8.96 | 22.76 |
| 10 | 0.73 | 5.27 | 13.37 |
| 15 | 1.01 | 7.54 | 19.15 |
| 20 | 1.10 | 7.41 | 18.82 |

TABLE 8

| | | Nominal line widths | | | | | |
|---|---|---|---|---|---|---|---|
| | | 2 mil | 3 mil | 5 mil | 10 mil | 15 mil | 20 mil |
| Compressive flex | % change in R | 4 ± 1.6 | 6.2 ± 0.9 | 7.3 ± 0.8 | 7.4 ± 0.2 | 8.4 ± 0.7 | 9.4 ± 1.3 |
| | open fails | 0/3 | 0/3 | 0/3 | 0/3 | 0/3 | 0/3 |
| Tensile flex | % change in R | 19.6 ± 3.9 | 21.8 ± 3.5 | 22.9 ± 5 | 22.8 ± 6 | 19.6 ± 0.7 | 21.8 ± 7 |
| | open fails | 0/3 | 0/3 | 0/3 | 0/3 | 0/3 | 0/3 |
| Compressive crease | % change in R | 4.7 ± 2 | 7.6 ± 3.9 | 7.2 ± 2.4 | 6.9 ± 2 | 9.4 ± 7 | 8.0 ± 2.8 |
| | open fails | 0/3 | 0/3 | 0/3 | 0/3 | 0/3 | 0/3 |
| Tensile crease | % change in R | 6.2 ± 2.2 | 5.9 ± 1.2 | 6.2 ± 0.7 | 5.9 ± 0.7 | 6.6 ± 0.2 | 7.5 ± 2 |
| | open fails | 0/3 | 0/3 | 0/3 | 0/3 | 0/3 | 0/3 |

Ink I4 was also screen printed on a Kapton™ substrate, dried in a reflow oven at 110° C. for 30 min then 250° C. for 15 min, and photo-sintered by PulseForge™ sintering at 2.87 J/cm$^2$ to form sintered copper traces on the substrate. Table 9 and Table 10 provide physical and electrical properties of the copper traces. Copper traces produced with this different sintering procedure had better conductivity and slump characteristics than the ones produced above.

TABLE 9

| Nominal linewidth (mil) | Ω | Measured Linewidth (mil) | Measured Linewidth (μm) | Ω/□ | mΩ/□ |
|---|---|---|---|---|---|
| 5 | 143 | 5.24 | 133 | 0.19 | 190 |
| 10 | 57 | 10.31 | 262 | 0.15 | 149 |
| 15 | 38 | 15.12 | 384 | 0.15 | 146 |
| 20 | 25 | 20.04 | 509 | 0.13 | 127 |

TABLE 10

| Nominal linewidth (mil) | Line thickness (μm) | Sheet resistivity (mΩ/□/mil) | Volume resistivity (μΩ · cm) |
|---|---|---|---|
| 5 | 0.63 | 4.68 | 11.88 |
| 10 | 1.16 | 6.82 | 17.32 |
| 15 | 0.99 | 5.66 | 14.37 |
| 20 | 1.24 | 6.21 | 15.77 |

Example 3-3—Ink I5

Ink I5 was screen printed on a Kapton™ substrate, dried in a reflow oven at 140° C. for 20 min, and photo-sintered by PulseForge™ sintering at 3.1 J/cm$^2$ to form sintered copper traces on the substrate. Table 11 and Table 12 provide physical and electrical properties of the copper traces and Table 13 provides mechanical properties (mechanical test as per ASTM F1683-02 flex & crease test). The results show that ink I5 having copper acetate, DMAPD, 20 wt % AgNO$_3$ and some added water provides photo-sintered conducting copper traces with excellent resolution and reasonable flex properties, even without a binder. Comparing Example 3-3 to Example 3-2 illustrates that using 20 wt % AgNO$_3$ does not improve over using 10 wt % AgNO$_3$.

TABLE 11

| Nominal linewidth (mil) | Ω | Measured Linewidth (mil) | Slump (mil) | Measured Linewidth (μm) | Ω/□ | mΩ/□ |
|---|---|---|---|---|---|---|
| 5 | 201 | 7.17 | 1.08 | 182 | 0.37 | 366 |
| 10 | 94 | 12.20 | 1.10 | 310 | 0.29 | 291 |
| 15 | 58 | 16.30 | 0.65 | 414 | 0.24 | 240 |
| 20 | 41 | 21.18 | 0.59 | 538 | 0.32 | 221 |

TABLE 12

| Nominal linewidth (mil) | Line thickness (μm) | Sheet resistivity (mΩ/□/mil) | Volume resistivity (μΩ·cm) |
|---|---|---|---|
| 5 | 0.52 | 7.42 | 18.83 |
| 10 | 0.65 | 7.40 | 18.79 |
| 15 | 0.73 | 6.90 | 17.52 |
| 20 | 1.10 | 9.51 | 24.15 |

TABLE 13

| | | Nominal line widths | | | |
|---|---|---|---|---|---|
| | | 5 mil | 10 mil | 15 mil | 20 mil |
| Compressive flex | % change in R | 6.1 ± 0.8 | 6.9 ± 0.3 | 8.8 ± 2.5 | 8.7 ± 1.6 |
| | open fails | 0/3 | 0/3 | 0/3 | 0/3 |
| Tensile flex | % change in R | 13.9 ± 1.1 | 16.7 ± 3.5 | 15.7 ± 0.9 | 16.3 ± 0.7 |
| | open fails | 0/3 | 0/3 | 0/3 | 0/3 |
| Compressive crease | % change in R | 8.4 ± 1.5 | 6.4 ± 0.85 | 7.9 ± 0.8 | 9 ± 2.2 |
| | open fails | 0/3 | 0/3 | 0/3 | 0/3 |
| Tensile crease | % change in R | 3.7 ± 3.3 | 6.5 ± 2 | 7.4 ± 3 | 8 ± 5 |
| | open fails | 0/3 | 0/3 | 0/3 | 0/3 |

Example 3-4—Ink C3

Ink C3 was screen printed on a Kapton™ substrate, dried in a reflow oven at 140° C. for 25 min, and photo-sintered by PulseForge™ sintering at 3.455 J/cm² to form sintered copper traces on the substrate. Table 14 and Table 15 provide physical and electrical properties of the copper traces and Table 16 provides mechanical properties (mechanical test as per ASTM F1683-02 flex & crease test). Comparing Example 3-4 to Example 3-1 shows that inks comprising copper acetate, DMAPD and a silver salt (Ink I3) have better conductivity and slump characteristics than inks comprising just copper acetate and DMAPD (Ink C3), while having similar mechanical properties.

TABLE 14

| Nominal linewidth (mil) | Ω | Measured Linewidth (mil) | Slump (mil) | Measured Linewidth (μm) | Ω/□ | mΩ/□ |
|---|---|---|---|---|---|---|
| 5 | 392 | 6.89 | 0.94 | 175 | 0.69 | 686 |
| 10 | 308 | 10.93 | 0.46 | 277 | 0.85 | 855 |
| 15 | 219 | 16.02 | 0.51 | 407 | 0.89 | 891 |
| 20 | 172 | 21.85 | 0.93 | 555 | 0.95 | 955 |

TABLE 15

| Nominal linewidth (mil) | Line thickness (μm) | Sheet resistivity (mΩ/□/mil) | Volume resistivity (μΩ·cm) |
|---|---|---|---|
| 5 | 0.51 | 13.64 | 34.64 |
| 10 | 0.78 | 26.08 | 66.23 |
| 15 | 0.90 | 31.58 | 80.21 |
| 20 | 0.93 | 34.76 | 88.30 |

TABLE 16

| | | Nominal line widths | | | |
|---|---|---|---|---|---|
| | | 5 mil | 10 mil | 15 mil | 20 mil |
| Compressive flex | % change in R | 8.6 ± 1.6 | 9 ± 0.4 | 9.7 ± 2 | 11 ± 1.5 |
| | open fails | 0/2 | 0/2 | 0/2 | 0/2 |

TABLE 16-continued

| | | Nominal line widths | | | |
|---|---|---|---|---|---|
| | | 5 mil | 10 mil | 15 mil | 20 mil |
| Tensile flex | % change in R open fails | 16 ± 2.1 0/2 | 16.4 ± 1.4 0/2 | 16.5 ± 1.7 0/2 | 17 ± 1.5 0/2 |
| Compressive crease | % change in R open fails | 4.2 ± 2.3 0/2 | 8.2 ± 2.9 0/2 | 8.3 ± 2.8 0/2 | 8.8 ± 1 0/2 |
| Tensile crease | % change in R open fails | 3.6 ± 0.2 0/2 | 5 ± 0.7 0/2 | 5.9 ± 0.1 0/2 | 5.7 ± 0.2 0/2 |

Example 3-5—Ink C4

Ink C4 was screen printed on a Kapton™ substrate, dried in a reflow oven at 140° C. for 45 min, and photo-sintered by PulseForge™ sintering at 2.76 J/cm$^2$ to form sintered copper traces on the substrate. Table 17 and Table 18 provide physical and electrical properties of the copper traces and Table 19 provides mechanical properties (mechanical test as per ASTM F1683-02 flex & crease test). Comparing Example 3-5 to Example 3-2 shows that inks comprising copper acetate, DMAPD and a silver salt (Ink I4) have better conductivity and slump characteristics than inks comprising copper acetate, DMAPD and copper nanoparticles (Ink C4).

TABLE 17

| Nominal linewidth (mil) | Ω | Measured Linewidth (mil) | Slump (mil) | Measured Linewidth (μm) | Ω/□ | mΩ/□ |
|---|---|---|---|---|---|---|
| 5 | 493 | 8.98 | 1.99 | 228 | 1.12 | 1124 |
| 10 | 145 | 14.72 | 2.36 | 374 | 0.54 | 542 |
| 15 | 84 | 18.46 | 1.73 | 469 | 0.39 | 394 |
| 20 | 63 | 21.10 | 0.55 | 536 | 0.34 | 338 |

TABLE 18

| Nominal linewidth (mil) | Line thickness (μm) | Sheet resistivity (mΩ/□/mil) | Volume resistivity (μΩ · cm) |
|---|---|---|---|
| 5 | 0.11 | 4.87 | 12.36 |
| 10 | 0.38 | 8.11 | 20.60 |
| 15 | 0.42 | 6.51 | 16.54 |
| 20 | 0.36 | 4.79 | 12.15 |

TABLE 19

| | | Nominal line widths | | | |
|---|---|---|---|---|---|
| | | 5 mil | 10 mil | 15 mil | 20 mil |
| Compressive flex | % change in R open fails | 4.1 ± 1.2 0/2 | 7.5 ± 0.9 0/2 | 7.3 ± 0.3 0/2 | 10 ± 6 0/2 |
| Tensile flex | % change in R open fails | 21 ± 1.9 0/2 | 16 ± 4.4 0/2 | 17 ± 0.7 0/2 | 15 ± 5 0/2 |
| Compressive crease | % change in R open fails | 7.5 ± 0.5 0/2 | 10 ± 5 0/2 | 7.4 ± 0.3 0/2 | 8 ± 0.3 0/2 |
| Tensile crease | % change in R open fails | 9 ± 1 0/2 | 8.2 ± 0.1 0/2 | 7.3 ± 1.6 0/2 | 10 ± 2.1 0/2 |

Example 3-6—Ink C5

Ink C5 was screen printed on a Kapton™ substrate. The consistency of the ink on the substrate was poor. The ink was then dried in a reflow oven at 110° C. for 10 min under nitrogen gas and photo-sintered by PulseForge™ sintering at 2.32 J/cm$^2$ to form sintered copper traces on the substrate. It was apparent from the traces on the substrate that considerable oxidation occurred both while drying and photo-sintering, even under the 99% nitrogen atmosphere. The traces themselves were poorly adhered to the substrates exhibiting copper flaking. An adhesive tape test on the copper traces resulted in the traces being badly damaged.

It is apparent from this example that copper acetate cannot be replaced with copper formate to produce a suitable ink.

Example 3-7—Ink C6

Ink C6 was screen printed on a Kapton™ substrate, dried in a reflow oven at 100° C. for 10 min, and photo-sintered by PulseForge™ sintering at 2.32 J/cm$^2$ to form sintered copper traces on the substrate. Table 20 and Table 21 provide physical and electrical properties of the copper traces and Table 22 provides mechanical properties (mechanical test as per ASTM F1683-02 flex & crease test). It is evident that copper traces produced from ink C6 have poor sheet and volume resistivity, have failures in the mechanical properties and have high slump. Comparing Example 3-7 to Example 3-1 shows that copper acetate cannot be replaced with copper formate to produce a suitable ink. Repeating the drying at higher and lower temperatures and for a longer amount of time did not improve conductivity.

TABLE 20

| Nominal linewidth (mil) | Ω | Measured Linewidth (mil) | Slump (mil) | Measured Linewidth (μm) | Ω/□ | mΩ/□ |
|---|---|---|---|---|---|---|
| 5 | 189 | 7.56 | 1.28 | 192 | 0.36 | 362 |
| 10 | 59.6 | 13.23 | 1.61 | 336 | 0.20 | 200 |

TABLE 20-continued

| Nominal linewidth (mil) | Ω | Measured Linewidth (mil) | Slump (mil) | Measured Linewidth (μm) | Ω/□ | mΩ/□ |
|---|---|---|---|---|---|---|
| 15 | 38.4 | 17.91 | 1.46 | 455 | 0.17 | 175 |
| 20 | 33.4 | 23.27 | 1.63 | 591 | 0.20 | 197 |

TABLE 21

| Nominal linewidth (mil) | Line thickness (μm) | Sheet resistivity (mΩ/□/mil) | Volume resistivity (μΩ · cm) |
|---|---|---|---|
| 5 | 2.03 | 28.96 | 73.54 |
| 10 | 3.95 | 31.14 | 79.10 |
| 15 | 7.55 | 51.93 | 131.91 |
| 20 | 5.50 | 42.70 | 108.46 |

TABLE 22

| | | Nominal line widths | | | |
|---|---|---|---|---|---|
| | | 5 mil | 10 mil | 15 mil | 20 mil |
| Compressive flex | % change in R | 16 ± 5.4 | 14.3 ± 3.6 | 17 ± 7.7 | 22 ± 16.5 |
| | open fails | 1/4 | 1/4 | 1/4 | 1/4 |
| Tensile flex | % change in R | 36 ± 4 | 40 ± 6 | 50 ± 23 | 48 ± 19.8 |
| | open fails | 2/4 | 2/4 | 2/4 | 2/4 |
| Compressive crease | % change in R | | | 84 | 246 |
| | open fails | 4/4 | 4/4 | 3/4 | 3/4 |
| Tensile crease | % change in R | | | | |
| | open fails | 4/4 | 4/4 | 4/4 | 4/4 |

Example 3-8—Ink C7

Ink C7 was screen printed on a Kapton™ substrate, dried in a reflow oven at 80° C. for 30 min, and photo-sintered by PulseForge™ sintering at 3.3 J/cm² to form sintered copper traces on the substrate. Table 23 and Table 24 provide physical and electrical properties of the copper traces and Table 25 provides mechanical properties (mechanical test as per ASTM F1683-02 flex & crease test). Replacement of the majority of the DMAPD with ethyl oxazoline made the ink difficult to screen print. Further, the resulting traces exhibited have failures in the mechanical properties and high slump. Also, oxidation occurred even under 99% nitrogen gas. Repeating the drying at higher and lower temperatures did not improve conductivity. It is evident that replacement of DMAPD with another amine leads to the inability to screen print and poorer quality copper traces.

TABLE 23

| Nominal linewidth (mil) | Ω | Measured Linewidth (mil) | Slump (mil) | Measured Linewidth (μm) | Ω/□ | mΩ/□ |
|---|---|---|---|---|---|---|
| 5 | 434 | 9.67 | 2.33 | 245.5 | 1.07 | 1065 |
| 10 | 253 | 12.56 | 1.28 | 319.0 | 0.81 | 807 |
| 15 | 215 | 16.50 | 0.75 | 419.0 | 0.90 | 901 |
| 20 | 169 | 22.66 | 1.33 | 575.5 | 0.97 | 973 |

TABLE 24

| Nominal linewidth (mil) | Line thickness (μm) | Sheet resistivity (mΩ/□/mil) | Volume resistivity (μΩ · cm) |
|---|---|---|---|
| 5 | 0.30 | 12.58 | 31.96 |
| 10 | 0.44 | 13.98 | 35.51 |
| 15 | 0.39 | 13.83 | 35.13 |
| 20 | 0.38 | 14.36 | 36.47 |

TABLE 25

| | | Nominal line widths | | | |
|---|---|---|---|---|---|
| | | 5 mil | 10 mil | 15 mil | 20 mil |
| Compressive flex | % change in R | 8.1 ± 2.8 | 10.2 ± 1.8 | 12.6 ± 1.9 | 14.2 ± 2.4 |
| | open fails | 0/5 | 0/5 | 0/5 | 0/5 |
| Tensile flex | % change in R | 16.6 ± 3 | 16.8 ± 0.7 | 20.3 ± 2.3 | 19.7 ± 1.7 |
| | open fails | 0/5 | 0/5 | 0/5 | 0/5 |
| Compressive crease | % change in R | 6.1 ± 6 | 5.2 ± 2.9 | 16.8 ± 18 | 13.2 ± 14 |
| | open fails | 0/5 | 2/5 | 0/5 | 1/5 |
| Tensile crease | % change in R | 7.2 ± 2.2 | 10 ± 0.3 | 15.6 ± 7.4 | 12.5 |
| | open fails | 3/5 | 3/5 | 3/5 | 4/5 |

Example 4—Comparison to Inks Formulated with Different Copper Precursors and Amines To assess the effect of replacing copper acetate and DMAPD with other copper precursor molecules and other amines, various inks were formulated in the same manner except that one or both of the copper acetate and DMAPD were replaced as indicated in Table 26. The inks were deposited on Kapton™ substrates and samples were thermally sintered under nitrogen gas with 500 ppm oxygen. As illustrated in Table 26, only inks having copper acetate and DMAPD were suitable.

TABLE 26

| Copper precursor | Amine | Thermal sintering |
|---|---|---|
| $Cu(CH_3COO)_2 \cdot H_2O$ | Diethanolamine | Screen-printable, non-conducting traces, unstable. |
| $Cu(CH_3COO)_2 \cdot H_2O$ | 3-dimethylamino-1,2-propanediol (DMAPD) | Screen-printable, conducting traces from both thermal and photo-sintering. |
| $Cu(CH_3COO)_2 \cdot H_2O$ | 3-Diethylamino-1,2-propanediol (DEAPD) | Conducting traces, resistance is too high. |
| $Cu(CH_3COO)_2 \cdot H_2O$ | 1-Diethylamino-2-propanol | Non-conducting traces, ink consistency is to runny. |
| $Cu(CH_3COO)_2 \cdot H_2O$ | 3-Diemthylamino-1-propanol | Non-conducting black traces, oxidation. |
| $Cu(CH_3COO)_2 \cdot H_2O$ | 3-Amino-1-propanol | Non-conducting black traces, oxidation. |
| $Cu(CH_3COO)_2 \cdot H_2O$ | 2-Amino-1-butanol | Non-conducting traces, ink forms complex. |
| $Cu(CH_3COO)_2 \cdot H_2O$ | Diisopropylaminoethanol | Non-conducting traces, ink consistency is to runny. |
| $Cu(CH_3COO)_2 \cdot H_2O$ | Butylamine | Non-conducting black traces, oxidation. |
| $Cu(CH_3COO)_2 \cdot H_2O$ | Octylamine | Non-conducting black traces, oxidation. |
| $Cu(CH_3COO)_2 \cdot H_2O$ | 3-Ethoxypropylamine | Non-conducting black traces, oxidation. |
| Cu oxalate hemihydrate | 3-Amino-1-propanol | Ink consistency not gel-like, formed crystals. |
| Cu oxalate hemihydrate | 3-dimethylamino-1,2-propanediol (DMAPD) | Ink consistency not gel-like, formed crystals, very hygroscopic. |
| $Cu(HCO_2)_2 \cdot H_2O$ | 3-dimethylamino-1,2-propanediol (DMAPD) | Ink consistency not gel-like, formed crystals, not screen-printable. |
| $Cu(NO_3)_2$ | 3-dimethylamino-1,2-propanediol (DMAPD) | Non-conducting black traces, oxidation. |
| $CuSO_4$ | 3-dimethylamino-1,2-propanediol (DMAPD) | Non-conducting black traces, oxidation. |
| $CuCl_2$ | 3-dimethylamino-1,2-propanediol (DMAPD) | Non-conducting black traces, oxidation. |
| $Cu(CO_3)_2$ | 3-dimethylamino-1,2-propanediol (DMAPD) | Not soluble. |
| $Cu(OH)_2 \cdot H_2O$ | 3-dimethylamino-1,2-propanediol (DMAPD) | Not soluble. |
| $Cu(OH)_2 \cdot H_2O$ | Ethoxypropylamine | Not soluble. |
| $Cu(OH)_2 \cdot H_2O$ | Methoxypropylamine | Not soluble. |
| $Cu(OH)_2 \cdot H_2O$ | Hexylamine | Not soluble. |
| $Cu(OH)_2 \cdot H_2O$ | Octylamine | Not soluble. |
| $Cu(OH)_2 \cdot H_2O$ | Butylamine | Not soluble. |

The novel features will become apparent to those of skill in the art upon examination of the description. It should be understood, however, that the scope of the claims should not be limited by the embodiments, but should be given the broadest interpretation consistent with the wording of the claims and the specification as a whole.

The invention claimed is:

1. A method of producing a conductive copper coating on a substrate, the method comprising: coating a substrate with a copper-based ink comprising copper acetate, 3-dimethylamino-1,2-propanediol and a silver salt, wherein the copper acetate and 3-dimethylamino-1,2-propanediol are in a molar ratio of about 1:1 to about 1:2; and, decomposing the ink on the substrate to form a conductive copper coating on the substrate, wherein the decomposing comprises thermal sintering in the presence of oxygen in an amount of 100 ppm to about 500 ppm of oxygen or photo-sintering in air, wherein the ink further comprises a solvent and a binder, the binder comprising a hydroxyl- and/or carboxyl-terminated polyester.

2. The method of claim 1, wherein the copper acetate and 3-dimethylamino-1,2-propanediol form a complex in the ink.

3. The method of claim 2, wherein the molar ratio is about 1:1.3.

4. The method of claim 1, wherein the copper acetate comprises copper acetate monohydrate in an amount that provides about 5 wt % to about 25 wt % of copper in the ink, based on total weight of the ink.

5. The method of claim 1, wherein the silver salt is in the ink in an amount of about 5 wt % to about 40 wt %, based on weight of total copper from the copper acetate.

6. The method of claim 1, wherein the silver salt comprises silver oxide, silver chloride, silver bromide, silver sulfate, silver carbonate, silver phosphate, silver acetate or silver nitrate.

7. The method of claim 1, wherein the silver salt comprises silver nitrate.

8. The method of claim 1, wherein the ink on the substrate is dried at a temperature of about 100-150° C. for a time of about 10-45 minutes.

9. The method of claim 1, wherein the decomposing comprises photo-sintering.

10. The method of claim 1, wherein the coating of the ink on the substrate comprises screen printing.

11. A copper-based ink comprising copper acetate, 3-dimethylamino-1,2-propanediol and a silver salt, wherein the copper acetate and 3-dimethylamino-1,2-propanediol are in a molar ratio of about 1:1 to about 1:2, wherein the ink is thermally sinterable in the presence of oxygen in an amount of 100 ppm to about 500 ppm of oxygen or photo-sinterable in air to produce conductive copper features, wherein the ink further comprises a solvent and a binder, the binder comprising a hydroxyl- and/or carboxyl-terminated polyester.

12. The ink of claim 11, wherein the copper acetate and 3-dimethylamino-1,2-propanediol form a complex in the ink.

13. The ink of claim 12, wherein the molar ratio is about 1:1.3.

14. The ink of claim 11, wherein the silver salt is in the ink in an amount of about 5 wt % to about 20 wt %, based on weight of the copper from the copper acetate.

15. The ink of claim 11, wherein the silver salt comprises silver oxide, silver chloride, silver bromide, silver sulfate, silver carbonate, silver phosphate, silver acetate or silver nitrate.

16. The ink of claim 11, wherein the silver salt comprises silver nitrate.

* * * * *